(12) United States Patent
Scheibner et al.

(10) Patent No.: US 6,720,127 B2
(45) Date of Patent: Apr. 13, 2004

(54) PRINTED CIRCUIT SUBSTRATE WITH CONTROLLED PLACEMENT COVERCOAT LAYER

(75) Inventors: John B. Scheibner, Austin, TX (US); Robert M. Anderton, Austin, TX (US); David L. Buster, Columbia, MO (US); Kristine J. Williams, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 27 days.

(21) Appl. No.: 09/995,313

(22) Filed: Nov. 28, 2001

(65) Prior Publication Data

US 2002/0037473 A1 Mar. 28, 2002

Related U.S. Application Data

(62) Division of application No. 09/378,080, filed on Aug. 20, 1999.

(51) Int. Cl.$^7$ .............................................. G03F 7/004
(52) U.S. Cl. ................. 430/270.1; 430/14; 430/271.1
(58) Field of Search ................. 430/270.1, 271.1, 430/14

(56) References Cited

U.S. PATENT DOCUMENTS

| | | | |
|---|---|---|---|
| 3,660,726 A | 5/1972 | Ammon et al. ...... 317/101 CM |
| 4,029,845 A | 6/1977 | Nomura ...................... 428/415 |
| 4,526,835 A | 7/1985 | Takahashi et al. ........... 428/413 |
| 4,987,100 A | 1/1991 | McBride et al. ............. 437/206 |
| 5,200,362 A | 4/1993 | Lin et al. ..................... 437/207 |
| 5,227,008 A | 7/1993 | Klun et al. ................... 156/630 |
| 5,334,487 A | 8/1994 | Kindl et al. .................. 430/312 |
| 5,336,564 A | 8/1994 | Moldavsky ................... 428/418 |
| 5,360,946 A | 11/1994 | Feger et al. .................. 174/261 |
| 5,557,844 A | 9/1996 | Bhatt et al. ..................... 29/852 |
| 5,612,511 A * | 3/1997 | Meyer et al. ................. 174/254 |
| 5,680,701 A | 10/1997 | Sippel ............................ 29/852 |
| 5,759,417 A | 6/1998 | Inaba ............................ 216/18 |
| 5,806,177 A | 9/1998 | Hosomi et al. ................ 29/846 |
| 6,423,470 B1 * | 7/2002 | Scheibner et al. ........ 430/275.1 |

FOREIGN PATENT DOCUMENTS

| | | | |
|---|---|---|---|
| DE | 4239324 A1 | 5/1993 | ........... H01L/23/29 |
| EP | 0500235 A1 | 8/1992 | ........... H01L/21/48 |
| EP | 0891127 A2 | 1/1999 | ........... H05K/3/28 |
| JP | 09298219 | 11/1997 | ........... H01L/21/60 |

OTHER PUBLICATIONS

"Protective Coating Process for Thin Film Processes", IBM Technical Disclosure Bulletin, vol. 33, No. 6B (IBM, New York), Nov. 1990, pp. 266–267.

* cited by examiner

Primary Examiner—John S. Chu
(74) Attorney, Agent, or Firm—Melanie G. Gover

(57) ABSTRACT

A covercoated base substrate, comprising a base substrate and a photoimageable covercoat layer having a lead portion extending beyond at least one, wherein the lead portion has a controlled offset distance from the edge, and a printed circuit made from such base substrate having at least one conductor including a trace and a lead wherein the covercoat has a lead portion covering at least one lead. A base substrate may also have an opening formed therethrough, the opening defining an interior edge wherein the covercoat extends beyond that interior edge.

8 Claims, 4 Drawing Sheets

PRINTED CIRCUIT SUBSTRATE WITH CONTROLLED PLACEMENT COVERCOAT LAYER

This is a divisional of application Ser. No. 09/378,080 filed Aug. 20, 1999, now pending.

BACKGROUND

The disclosures herein relate generally to flexible circuits and more particularly to flexible circuits with covercoat layers formed to have a controlled placement.

Flexible circuits generally include a pattern of conductive traces that are supported on a base substrate such as a layer of dielectric material. The conductive traces typically have a copper core plated with a corrosion resistant material such as gold. Polyimide is a common base substrate. U.S. Pat. Nos. 4,987,100; 5,227,008; 5,334,487; 5,557,844 and 5,680,701 disclose processes for fabricating printed circuits having a flexible polymeric base substrate such as polyimide. U.S. Pat. Nos. 3,660,726; 4,029,845; 4,526,835; and 5,806,177 disclose processes for fabricating printed circuits having a generally rigid base substrate such as a glass reinforced epoxy composite.

Electronic packages, medical devices, hard disk drive suspensions and ink jet printer pens are common applications for flexible circuits. Flexible circuits offer attributes such as fine pitch traces, complex circuit designs and flexibility. Depending on the design and specific application, a flexible circuit may have an opening formed in the base substrate. One or more of the conductive traces may include a lead that extends in a cantilevered manner from an edge of the opening. The leads may also be formed in a manner in which they the span across the opening.

In some applications, flexible circuits may be exposed to an aggressive environment. Unprotected conductive traces and the interface between the conductive traces and the base substrate are two areas susceptible to being affected by adverse environmental conditions such as exposure to corrosive fluids. Exposing unprotected conductive traces to adverse environmental conditions typically leads to the traces corroding or delaminating from the base substrate.

The flexible circuit is typically attached to a rigid structure such as a stiffening member or the body of a printer pen. The leads may be interconnected to an electronic device carried by the rigid structure or to an electronic device that is attached directly to the base substrate of the flexible circuit. Typically, the side of the base substrate carrying the conductive traces is attached to the rigid structure. An encapsulant is typically applied over the leads to provide a degree of protection from adverse environmental conditions.

A covercoat layer is sometimes formed over the conductive traces to prevent the traces from being exposed to adverse environmental conditions. The covercoat layer is often a photoimageable material that is patterned using UV light and a photomask. Due to limitations in conventional methods of forming the covercoat layer, the resulting covercoat layer does not have a uniform and controlled thickness or a well-defined pattern. In some areas, the thickness of the covercoat can be insufficient to provided adequate protection against adverse environmental conditions. This is often the case with circuits having portions of the traces beyond an edge of the substrate (called leads).

An encapsulant is often applied to protect the leads. Depending on the type of device attached to the leads, the encapsulant may also be used to protect the device (e.g. a bare semiconductor chip). Because of the orientation of the flexible circuit, it is easy to encapsulate the outward facing side of the conductive traces. However, reliably encapsulating the inward facing side of the circuit is difficult. Air pockets formed adjacent to the leads during encapsulation can serve as pathways for contaminants to reach the traces. Over time, traces having an insufficient thickness of covercoat material can be attacked by contaminants, causing the flexible circuit, the attached device, or both, to fail.

Accordingly, a need has arisen for a base substrate having a covercoat formed thereon in which the shortcomings of previous techniques and constructions are overcome.

It has now been discovered that a photoimageable covercoat can be formed which has controlled placement beyond the base substrate and onto the lead portion of the conductors. Use of a covercoat with such improved placement characteristics also helps to alleviate problems caused by air pockets in the encapsulant by providing an additional layer of protection. Further, a photoimageable covercoat can be formed which can be coated to a controlled thickness beyond the edge of the base substrate to assist in corrosion protection, and the like.

SUMMARY

The invention provides a printed circuit having improved resistance to adverse environmental conditions. The printed circuit includes a base substrate having conductors formed thereon. A portion of some or all of the conductors form traces and a portion form leads extending from an edge of the base substrate. A photoimageable covercoat layer is formed on the base substrate including a lead portion formed on the leads extending beyond the substrate at one or more edges. The lead portion of the photoimageable covercoat layer has a controlled and substantially uniform placement, i.e., a predetermined and substantially controlled offset distance.

The lead portion of the photoimageable covercoat may be a direct extension of a trace portion of the photoimageable covercoat, i.e., it may be a continuous coating, or it may be a completely detached coating.

The base substrate and printed circuits formed therefrom also have a nonconductive portion, i.e., that part of the substrate which is uncovered by a conductor. Some or all of this portion may also be covered by the covercoat.

n a preferred embodiment, the photoimageable covercoat also has a controlled thickness beyond the edge of the base substrate, and covers at least a portion of the upper surface and the lower surface of the leads.

A principal advantage of the embodiments presented herein is that the leads can be encapsulated with a uniform layer of covercoat material to reduce the potential of the leads being attacked by contaminants. A uniform layer of covercoat can be formed on the leads to encapsulate and protect the leads.

Another principal advantage is the ability, when using a substrate having an interior opening, to form three-dimensional features within the opening on the lead portion of the covercoat; a conductor having a lead extending into such opening need not be present to form such a feature.

As used herein, these terms have the following meanings:
  1. The term "trace" refers to that portion of the conductor (s) which is supported on a base substrate.
  2. The term "lead" refers to that portion of the conductor (s) which is unsupported by the base substrate, e.g., a conductor extending beyond an edge of the polyimide substrate.

3. The term "lead portion" when referring to the photo-imageable covercoat refers to the portion of the covercoat which extends beyond an edge of the polyimide substrate. Note: this term is used for the portion of the covercoat extending beyond an edge of the substrate whether or not a conductor lead also extends therefrom.
4. The term "trace portion", when referring to the photo-imageable covercoat refers to the portion of the covercoat which coats at least one trace portion of the conductor on the base substrate.
5. The term "UV" means ultraviolet and refers to radiation from a source having wavelengths of from about 100 to about 4500 Angstroms.
6. The term "offset distance" means the distance which the photoimageable covercoat extends beyond the edge of the base substrate.
7. The term "line and space pattern" means a photomask is used that allows only certain portions of the covercoat surface to be exposed to UV, while other areas receive no UV exposure.
8. The term "flood" or "flood expose" refers to a UV exposure in which at least one entire covercoat surface is exposed to UV.
9. The term "interior edge" refers to an edge originally facing an opening formed in the interior of a base substrate during processing. Such an edge may become an exterior edge on the final circuit after singulation.

BRIEF DESCRIPTION OF THE DRAWING FIGURES

DETAILED DESCRIPTION

Figure 1:
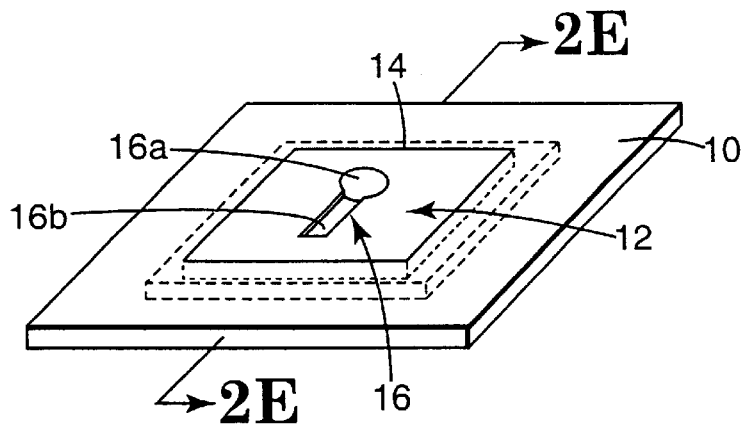
FIG. 1 is a perspective view illustrating an embodiment of a base substrate with a photoimageable covercoat layer formed in an opening in the base substrate.

A base substrate 10, FIG. 1, includes a photoimageable covercoat layer 12 (hereinafter referred to as the covercoat layer 12) formed in an opening 14. The base substrate 10 may be a flexible dielectric substrate such as polyimide, a rigid dielectric substrate such as a glass reinforced epoxy composite material, a conductive material such as aluminum or other suitable types of substrates for an intended application. The covercoat layer 12 may be formed to include one or more photoimaged features 16 having a passage 16a that extends through the entire thickness of the covercoat layer 12 and a channel 16b that extends only partially through the covercoat layer 12.

Indeed, use of the preferred process enables creation of complex three-dimensional dielectric features within the polyimide openings. In this embodiment, the feature is typically formed in an opening in the interior of the base substrate. This feature is formed by UV exposure of differing patterns on the top and bottom sides of the flexible circuit. Photosensitive covercoat materials typically exhibit a limited depth of UV cure; i.e., the cure does not penetrate to the full thickness of the films. As shown, these features and be channels whose depth is only a portion of the thickness of the covercoat. These features can be created by exposing one side of the flexible circuit to a "line and space" pattern and flood exposing the other side. The depth of the channel is controlled by the UV dosage applied to the flood exposed side.

Many materials that are used as photoimageable covercoat layers are formulated to be crosslinked in the presence of UV light to facilitate patterning and cured in the presence of heat to achieve enhanced resistance to adverse environmental conditions, such as corrosive fluids or gases, biological contaminants, etc. Suitable covercoat materials include photoimageable epoxy acrylates, polyimides, and the like. Commercially available materials include the product sold under the trademark "Imageflex" by Coates Circuit Products under the part number XV601T; "PSR-4000/AUS5" sold by Taiyo America; "NPR-80/ID431" sold by Nippon Polytech Corporation; the product sold by Olin-Arch under the trademark "Probimide", under the series number 7500 and the product sold under the trademark "Carapace-A" by Electra Polymers and Chemicals America under the part number EMP110.

Figure 2A:
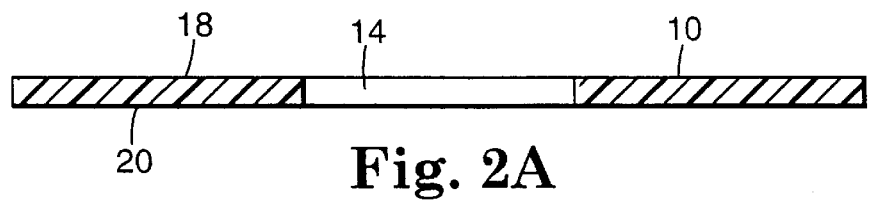
FIGS. 2A–2D are cross sectional views illustrating an embodiment of a method of forming a photoimageable covercoat layer.
Figure 2B:
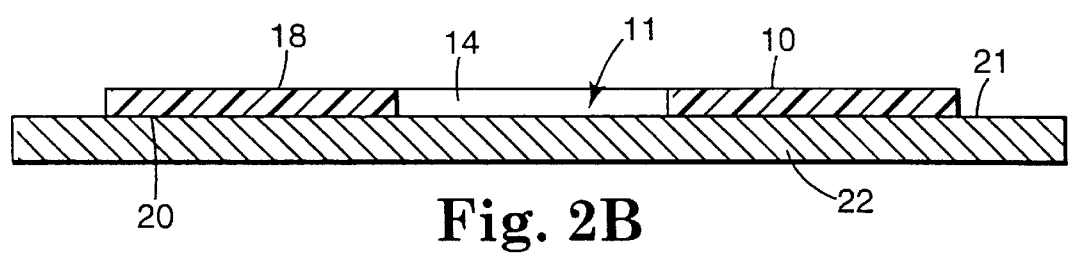

A method of forming the preferred covercoat layer 12 on the base substrate 10 is illustrated in FIGS. 2A to 2E. This method is also depicted in the flow chart of FIG. 3. The opening 14 is formed in the base substrate 10. The base substrate 10 has a first side 18 and a second side 20. A first side 21 of an adhered liner 22, FIG. 2B, is laminated to the second side 20 of the base substrate 10. The adherent liner 22 may be a low-tack tape having a backing such as polyester with a layer of acrylic, mastic, rubber or other suitable adhesive formed on the backing. A key requirement for the adherent liner 22 is that it should not build adhesion over time so that it can be easily removed from the base substrate 10. Another requirement is that the adherent liner removal should exhibit substantially no adhesive transfer to the substrate.

Figure 2C:
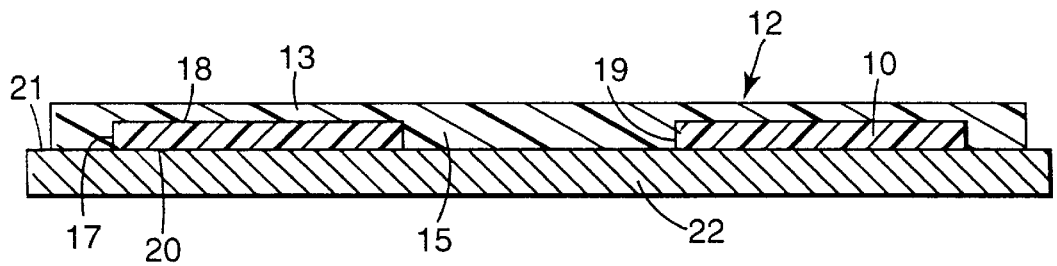
Figure 3:
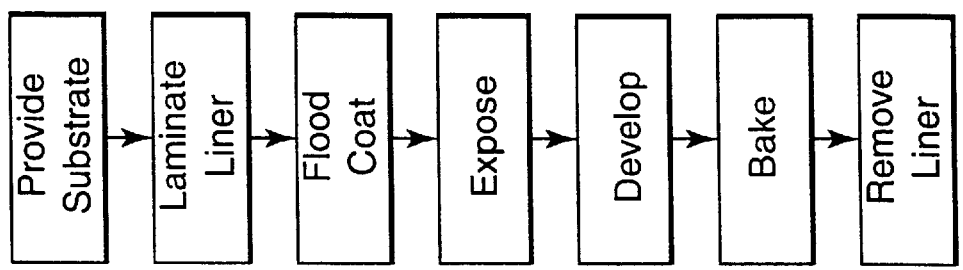
FIG. 3 is a flow chart illustrating an embodiment of a method of forming a photoimageable covercoat layer.

The covercoat layer 12, FIG. 2C, is then formed over the first side 18 of the base substrate 10 and into the cavity 11, FIG. 2B, defined by the opening 14 and the adherent liner 22. The covercoat layer may be formed by applying a layer of a liquid covercoat material using a coating method such as knife coating, extrusion die coating, curtain rod coating, screen printing, spray coating or other suitable known methods of forming a layer of covercoat material. The covercoat layer 12 is then dried at ambient temperature or in a suitable drying apparatus such as an air convection oven. Other methods of forming a covercoat layer such as laminating a dry film layer to the substrate are also contemplated within the scope of the present disclosure.

As shown in FIG. 2C, the covercoat layer 12 includes a trace portion 13 and a lead portion 15. The trace portion 13 of the covercoat layer 12 is that portion formed on the base substrate 10. The lead portion 15 of the covercoat layer 12 is that portion of the covercoat layer 12 formed on the adherent liner 22. The lead portion of the covercoat layer 12 may be formed adjacent to an exterior edge 17, an interior edge 19 or both edges.

Figure 2D:
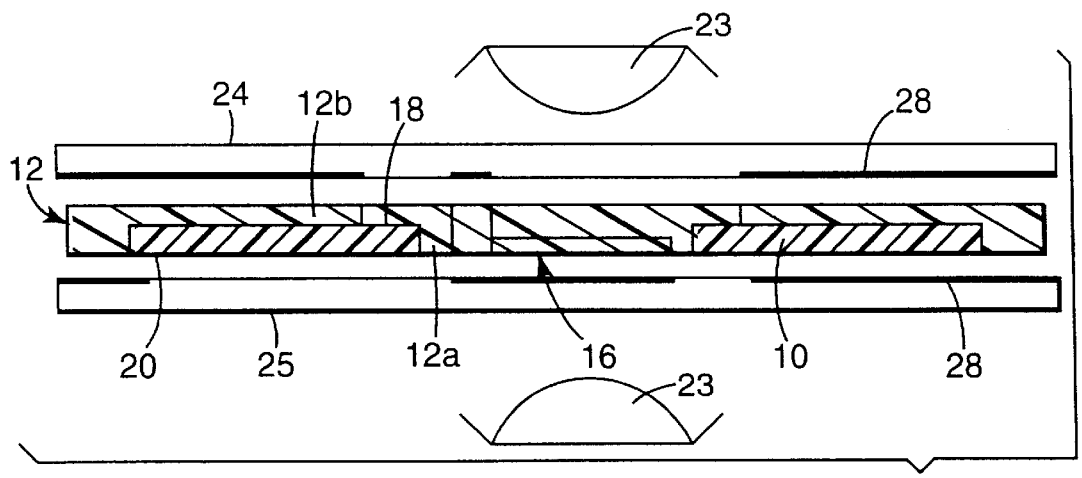

Next, the covercoat layer 12 is photoimaged, FIG. 2D. The photoimaging step includes exposing and developing the covercoat layer 12. The exposure step includes exposing the covercoat layer 12 to a light source 23 such as a UV lamp. The depth to which the material is crosslinked relative to the overall thickness of the covercoat layer 12 is generally a function of the applied exposure energy. Generally speaking, the thickness of the crosslinked material increases with increasing exposure energy. The relationship between the thickness of the crosslinked material and the exposure energy contributes to enabling the thickness of the lead portions 15 of the covercoat layer 12 to be formed to a controlled and uniform thickness.

Where one or more photoimaged features 16 are desired, a first photomask 24, FIG. 2D, may be positioned adjacent to the covercoat layer 12 and a second photomask 25 may optionally be positioned adjacent the second side 20 of the base substrate 10. The photomasks 24, 25 each include opaque regions 28 formed in a desired pattern. The opaque regions 28 preclude light from being exposed to the underlying regions of the covercoat layer 12. Upon exposing the covercoat layer 12 to a light source 23, the photomasks 24, 25 produce exposed portions 12a and unexposed portions 12b, FIG. 2D. Commercially available equipment may be used to expose the covercoat layer 12.

Following the covercoat layer 12 being exposed, it is subjected to a developing solution. When a negative-acting photoimageable material is used, the portions not exposed to the UV light will be removed during the developing step. When a positive-acting photoimageable material is used, the portions exposed to the UV light will be removed by the developing solution. After the covercoat layer 12 is developed, it is cured by conventional methods, e.g., thermally cured at an elevated temperature in an air convection oven, cured using infrared radiation, of simply dried at ambient temperature although this is less preferred in manufacturing due to time constraints.

Figure 2E:
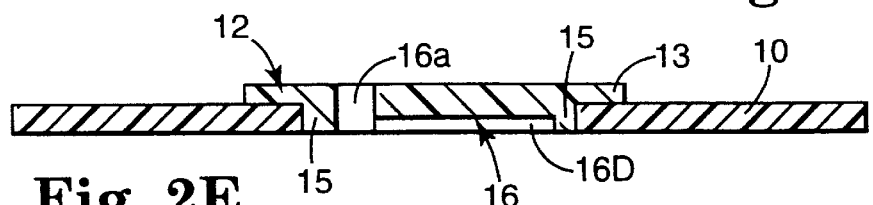
FIG. 2E is a cross sectional view taken at line 2E—2E in FIG. 1.

FIG. 2E shows a photoimaged feature 16 which has been formed over the interior opening.

In a lesser preferred method for forming a covercoat layer, a non-adherent liner is used. The non-adherent liner is brought into contact with, but not adhered to, the base substrate. The liner prevents covercoat material applied adjacent to openings in the base substrate and adjacent to the edges of the base substrate from contaminating the process equipment. However, because the non-adherent liner is not physically attached to the base substrate, it is somewhat susceptible to shifting relative to the base substrate during processing, and assists in placement of the covercoat. To prevent the non-adherent liner from shifting and unintentionally smearing covercoat material onto adjacent areas of the base substrate, the non-adherent liner is removed prior to the covercoat layer being dried. During the drying process, the covercoat material adjacent to the edges of the substrate may flow into adjacent portions of the base substrate, causing the thickness of the covercoat layer to be non-uniform. Accordingly, the use of a non-adherent liner reduces the formation of a uniform and controlled thickness on the lead portion.

In the preferred method of forming the covercoat, attachment of the adherent liner 22 to the base substrate 10 enables the formation of a covercoat layer 12 including lead portions 15 having a relatively controlled and uniform placement and thickness. Because the adherent liner 22 is adhesively attached to the base substrate 10 it can remain attached to the base substrate 10 until after the covercoat layer 12 is dried. Depending on the process equipment and desired process sequence, the adherent liner 22 may be removed prior to the covercoat layer 12 being exposed or after the covercoat layer 12 is exposed.

The adherent liner precludes the covercoat material from flowing during the drying step such that the lead portion 15 of the covercoat layer 12 has a controlled and uniform thickness. The adherent liner 22 also enables the covercoat layer 12 to be photoimaged in a manner that produces a covercoat over the leads (lead portion) 15 having a controlled offset distance 35, FIG. 5. The offset distance 35 is defined to be the distance from the adjacent respective edge of the base substrate 10 to the far edge of the lead portion 15 of the covercoat.

Figure 4:
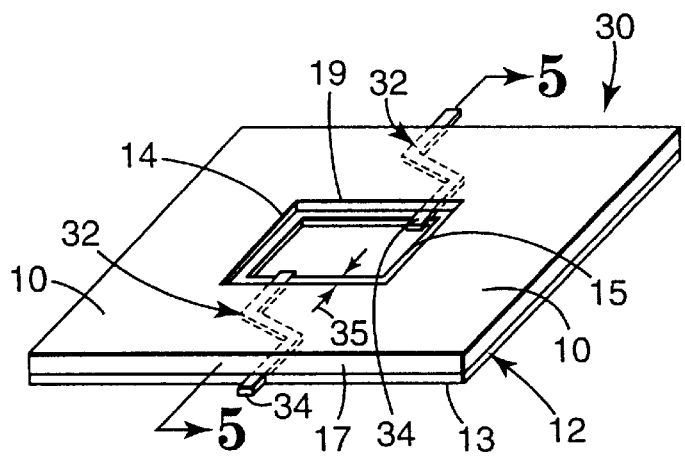
FIG. 4 is a perspective view illustrating an embodiment of a printed circuit having a photoimageable covercoat layer formed thereon.
Figure 5:
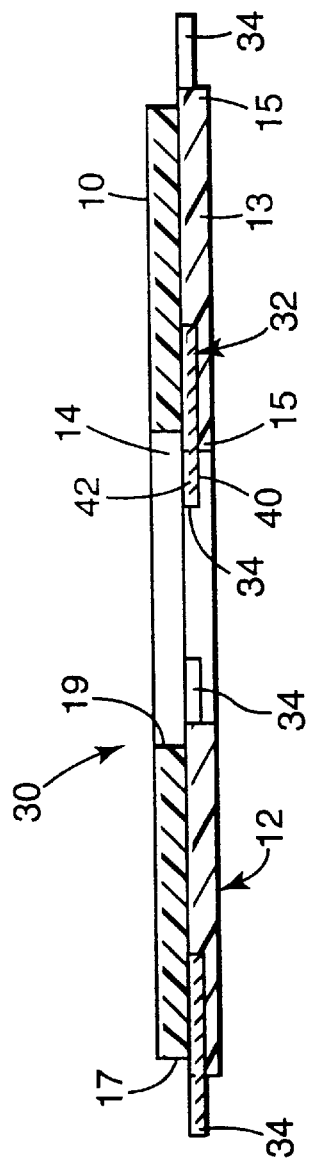
FIG. 5 is a cross sectional view taken at line 5—5 in FIG. 4.

An embodiment of a printed circuit 30 is illustrated in FIGS. 4 and 5. One or more conductors are formed on the base substrate 10. Each conductor includes a trace 32 and may be formed to include a lead 34 that extends from the interior edge 19, the exterior edge 17 or both edges of the base substrate 10. As shown in FIG. 5, the lead portion 15 of the covercoat layer 12 is formed to cover at least a portion of the top surface 40 and the side surfaces 42 (only one side surface shown) of each lead 34.

Figure 6:
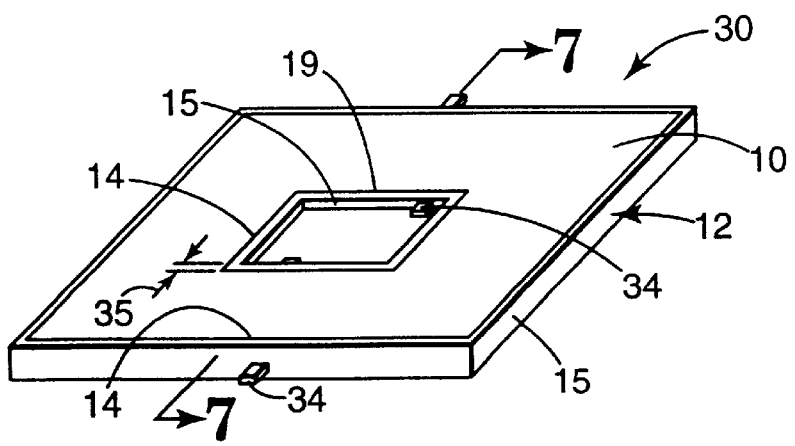
FIG. 6 is a perspective view illustrating another embodiment of a printed circuit having a photoimageable covercoat layer formed thereon.
Figure 7:
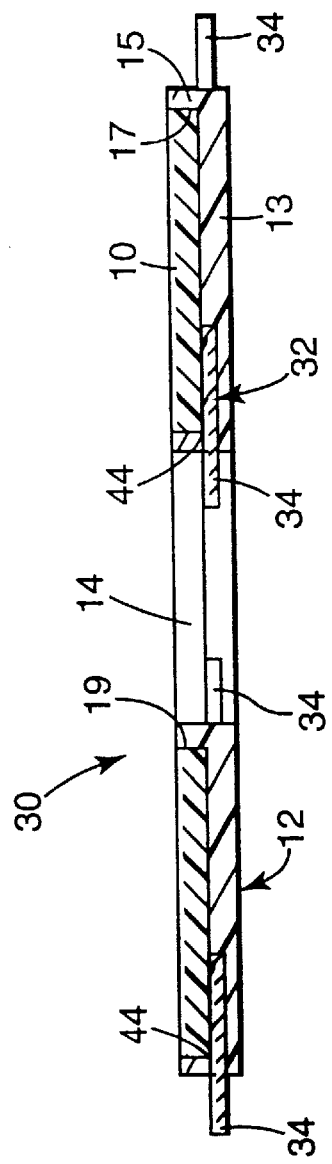
FIG. 7 is a cross sectional view taken at line 7—7 in FIG. 6.

Another embodiment of a printed circuit 30 is illustrated in FIGS. 6 and 7. The lead portion 15 of the covercoat layer 12 encapsulates a portion of each lead 34. The lead portion of the covercoat layer 12 also encapsulates an edge interface 44, FIG. 7, established at the intersection of each lead 34 and the respective edge of the base substrate 10. Encapsulating the edge interface 44 and the portion of each lead 34 formed adjacent to the edge interface 44 reduces the potential for failures associated with corrosion at the edge interface 44.

Figure 8:
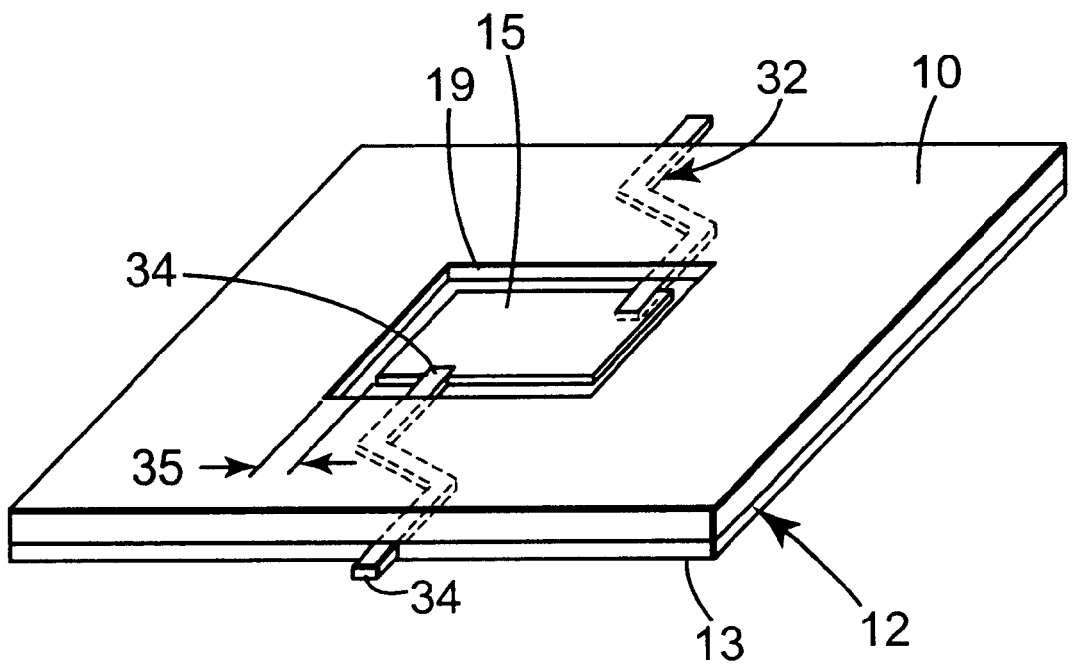
FIG. 8 is a perspective view illustrating an embodiment of a printed circuit with a lead portion of the covercoat layer being spaced apart from a trace portion.

FIG. 8 illustrates yet another embodiment of a printed circuit wherein the lead portion 15 of the covercoat layer 12 is completely detached from the trace portion 13. The covercoat layer 12 is formed such that the lead portion 15 is carried by the leads 34 and is spaced apart from the trace portion 13 by a controlled and uniform offset distance 35. The lead portion 15 of the covercoat layer 12 may be formed to fully or partially encapsulate the adjacent portion of one or more leads 34.

In another embodiment, a substrate includes a base substrate having an opening formed therethrough. The opening defines an interior edge. A photoimageable covercoat layer is formed on the base substrate. The photoimageable covercoat layer includes a lead portion formed in the opening. The lead portion has a controlled offset distance and controlled and substantially uniform thickness.

A further embodiment provides a method of forming a covercoat layer on a base substrate. The method includes the steps of providing a base substrate having opposing sides; laminating an adherent liner to a side of the base substrate; forming a photoimageable covercoat layer having a lead portion formed on the adherent liner; and photoimaging the lead portion of the photoimageable covercoat layer.

As it can be seen, the embodiments presented herein provide several advantages, including the following advantages. The edge interface and the surfaces of a trace adjacent the edge interface can be encapsulated by the covercoat layer. The covercoat layer can be formed to include a lead portion. The lead portion of the covercoat layer may be attached to the trace portion or completely detached from an edge of the base substrate by a controlled offset distance. In the preferred embodiment, the thickness of the lead portion of the covercoat layer is also controlled as desired, and is substantially uniform, although nonuniform thickness can also be made by this controlled method where desired. The covercoat layer can be patterned to include one or more photoimaged features, and the method of manufacturing the embodiments presented herein is economical to implement.

EXAMPLE 1

A flexible circuit having a polyimide base substrate with an opening formed through the base substrate was provided. The opening defines an interior edge. The flexible circuit has a plurality of conductive traces formed on a first side of the base substrate. At least a portion of the conductive traces includes a lead extending from the interior edge of the base substrate. An adherent liner having a polyester backing with a highly crosslinked acrylate adhesive was laminated to a second side of the base substrate. The liner and the opening define a cavity. A layer of liquid photoimageable covercoat resin sold by Nippon Polytech (Stock No. NPR80/431) was coated onto the first side of the base substrate in a manner in which the covercoat substantially fills the cavity. The covercoat layer was then dried in an air convection oven at approximately 80° C. for approximately 30 minutes. Following the drying step, the tape was removed from the base substrate. A patterned photomask was positioned adjacent to the covercoat layer and the covercoat layer was then exposed to a UV light source from the first side of the base substrate. The UV light source was set to provide approximately 500 mj/cm$^2$. The UV dosage was specified to provide sufficient energy to cure the covercoat to a depth approximately equal to the thickness of the conductive traces. The covercoat was then developed in an alkali solution to remove the appropriate areas of the covercoat layer. The circuit was then baked at approximately 150° C. for approximately 30 minutes to complete the curing of the covercoat layer. The resulting printed circuit resembles the embodiment illustrated in FIG. 5.

EXAMPLE 2

A circuit was formed using the same method as in Example 1, except that the covercoat was exposed to UV light from both sides of the base substrate. The two-sided exposure process provides a circuit wherein the top, bottom and sides of the leads are encapsulated with covercoat. The resulting printed circuit resembles the embodiment illustrated in FIG. 7.

A wide range of modification, change and substitution is contemplated in the foregoing disclosure and in some instances, some features of the embodiments may be employed without a corresponding use of other features. Accordingly, it is appropriate that the appended claims be construed broadly.

What is claimed is:

1. A covercoated base substrate, comprising:

a base substrate having an opening formed therethrough, the opening defining an interior edge; and a photoimageable covercoat layer having a lead portion extending beyond the interior edge into the opening, the covercoat layer having a controlled offset distance.

2. The base substrate of claim 1 wherein said base substrate includes at least one conductor, said conductor including a trace portion and a lead portion, said lead also extending into said opening.

3. The base substrate of claim 2 wherein said covercoat covers at least one lead.

4. The base substrate of claim 1 wherein said lead portion has a controlled thickness.

5. The base substrate of claim 1 wherein said controlled thickness is substantially uniform.

6. The base substrate of claim 1 wherein the lead portion of the photoimageable covercoat layer includes a three-dimensional photoimaged feature formed therein.

7. The base substrate of claim 6 wherein the photoimaged feature includes a channel having a depth of less than the controlled thickness of the covercoat.

8. The base substrate of claim 6 wherein the photoimaged feature includes a passage completely through said covercoat.

* * * * *